US012640172B2

(12) United States Patent     (10) Patent No.:   US 12,640,172 B2
    Zlotnik     (45) Date of Patent:     May 26, 2026

(54) POWER CONTROL CHAIN

(71) Applicant: Micron Technology, Inc., Boise, ID (US)

(72) Inventor: Leon Zlotnik, Camino, CA (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 18/766,414

(22) Filed: Jul. 8, 2024

(65) Prior Publication Data

US 2025/0022492 A1     Jan. 16, 2025

Related U.S. Application Data

(60) Provisional application No. 63/513,266, filed on Jul. 12, 2023.

(51) Int. Cl.
*G11C 5/14*     (2006.01)

(52) U.S. Cl.
CPC .................................... *G11C 5/148* (2013.01)

(58) Field of Classification Search
CPC ....... G11C 5/148; G11C 5/14; G11C 11/4074; G11C 11/413

USPC ......................................................... 365/227
See application file for complete search history.

(56) References Cited

U.S. PATENT DOCUMENTS

| | | | |
|---|---|---|---|
| 8,060,767 B1 | 11/2011 | Wright | |
| 9,672,186 B2 | 6/2017 | Desposito et al. | |
| 10,819,548 B2 | 10/2020 | Lee et al. | |

FOREIGN PATENT DOCUMENTS

WO     WO-2012045627 A1   *   4/2012   .......... H04L 9/0866

* cited by examiner

*Primary Examiner* — Fernando Hidalgo
(74) *Attorney, Agent, or Firm* — Brooks, Cameron & Huebsch, PLLC

(57) ABSTRACT

A method includes determining that a power event involving a memory sub-system has occurred. The method further including in response to the determination that the power event has occurred, generating signaling indicative of performance of an operation to provide power to a plurality of memory components of the memory sub-system, where the signaling indicative of performance includes a power control signal is applied to a first memory component at a first time, and is applied to a second memory component at a second time that is subsequent to the first memory component entering a steady state.

20 Claims, 9 Drawing Sheets

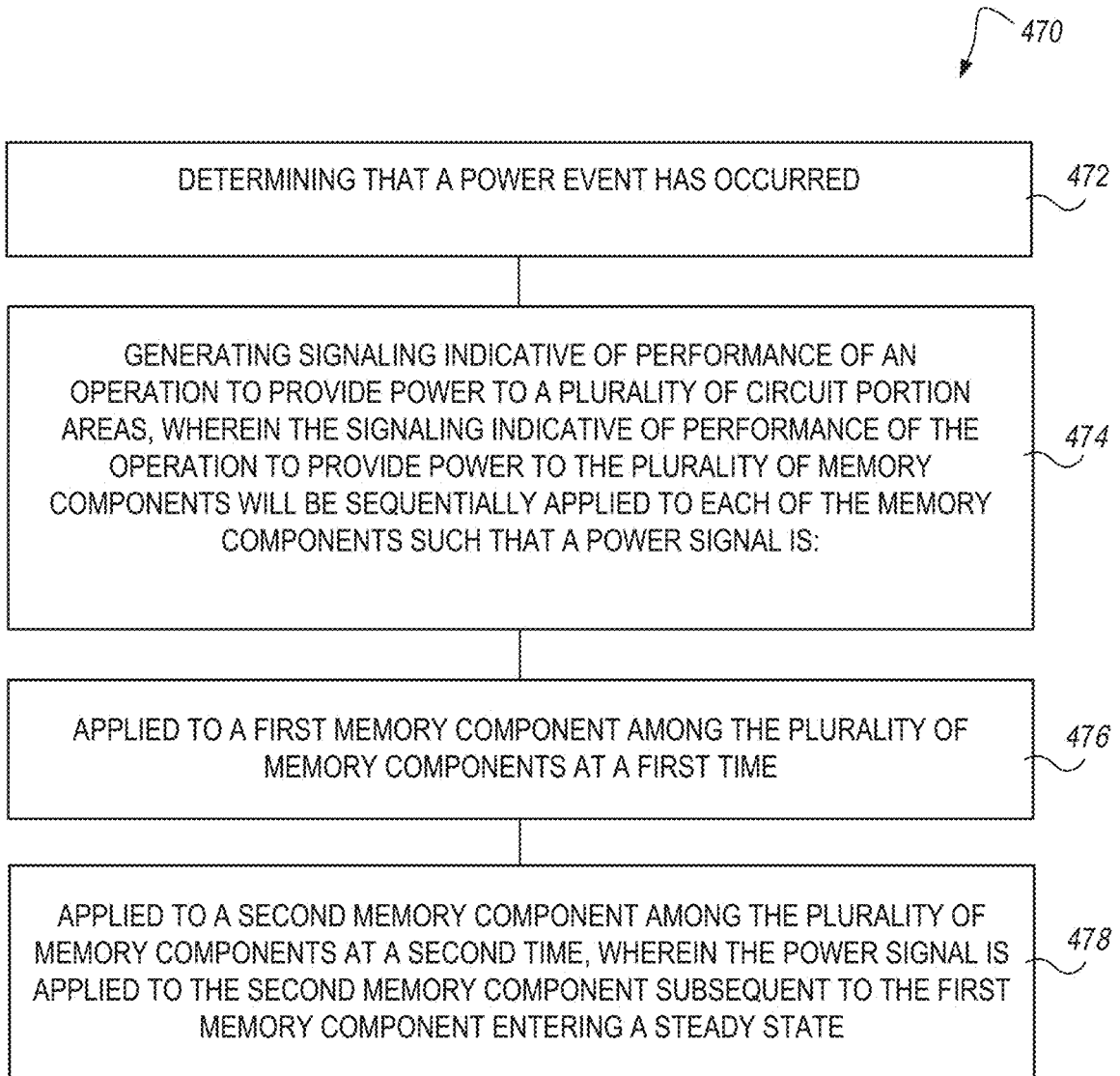

_470_

DETERMINING THAT A POWER EVENT HAS OCCURRED _472_

GENERATING SIGNALING INDICATIVE OF PERFORMANCE OF AN OPERATION TO PROVIDE POWER TO A PLURALITY OF CIRCUIT PORTION AREAS, WHEREIN THE SIGNALING INDICATIVE OF PERFORMANCE OF THE OPERATION TO PROVIDE POWER TO THE PLURALITY OF MEMORY COMPONENTS WILL BE SEQUENTIALLY APPLIED TO EACH OF THE MEMORY COMPONENTS SUCH THAT A POWER SIGNAL IS: _474_

APPLIED TO A FIRST MEMORY COMPONENT AMONG THE PLURALITY OF MEMORY COMPONENTS AT A FIRST TIME _476_

APPLIED TO A SECOND MEMORY COMPONENT AMONG THE PLURALITY OF MEMORY COMPONENTS AT A SECOND TIME, WHEREIN THE POWER SIGNAL IS APPLIED TO THE SECOND MEMORY COMPONENT SUBSEQUENT TO THE FIRST MEMORY COMPONENT ENTERING A STEADY STATE _478_

*FIG. 4*

POWER CONTROL CHAIN

PRIORITY INFORMATION

This application claims the benefit of U.S. Provisional Application No. 63/513,266, filed on Jul. 12, 2023, the contents of which are incorporated herein by reference.

TECHNICAL FIELD

Embodiments of the disclosure relate generally to memory sub-systems, and more specifically, relate to a power control chain.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 is a flow diagram corresponding to a method for a memory sub-system power control chain in accordance with some embodiments of the present disclosure.

DETAILED DESCRIPTION

Figure 1:
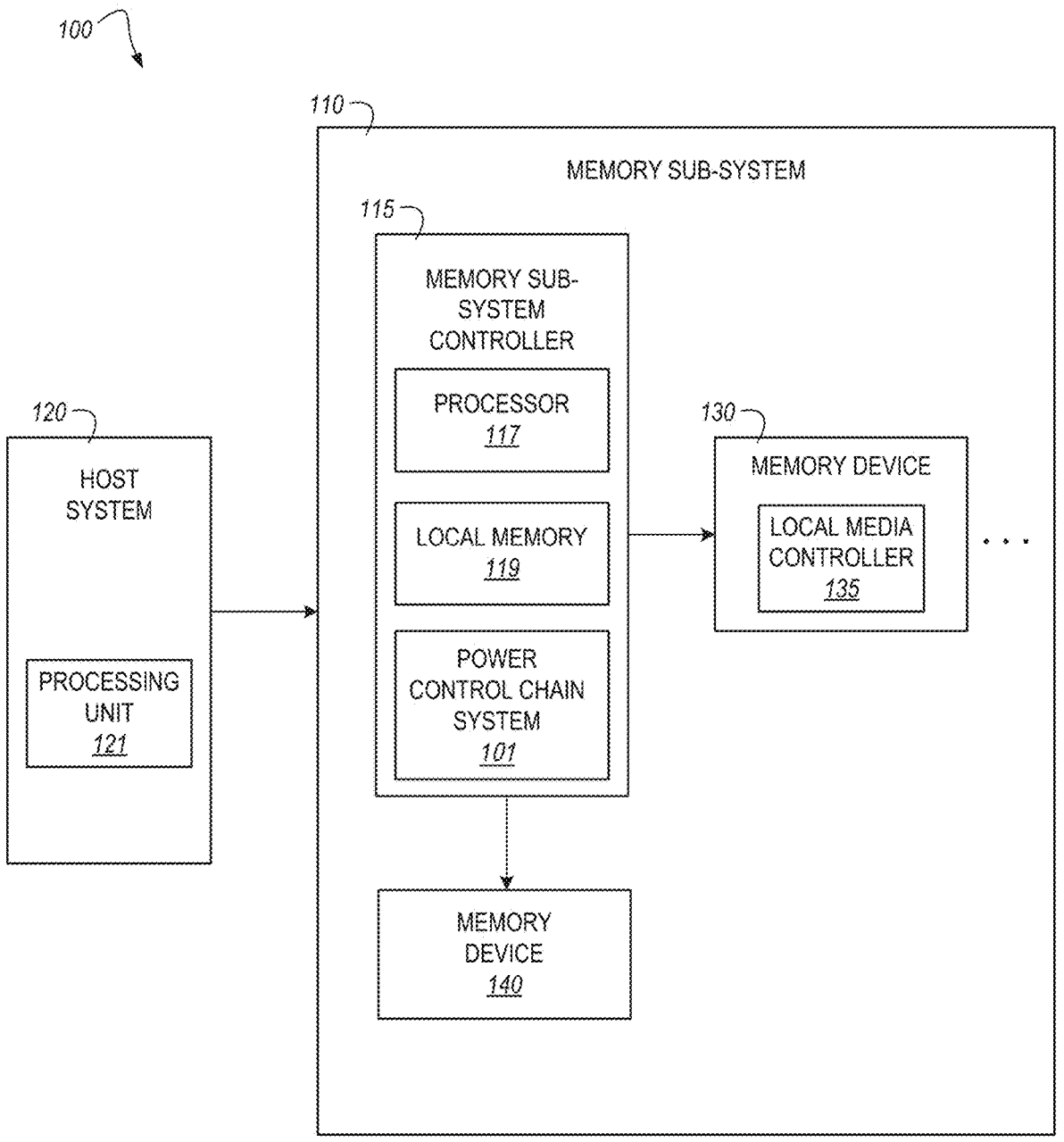
FIG. 1 illustrates an example computing system that includes a memory sub-system in accordance with some embodiments of the present disclosure.

Aspects of the present disclosure are directed to a power control chain (PCC) system in particular to memory sub-systems that include a PCC system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

Although non-limiting examples herein are generally described in terms of applicability to memory systems and sub-systems and/or to memory devices, embodiments are not so limited, and aspects of the present disclosure can be applied as well to a system-on-a-chip, computing system/sub-system, data collection and processing, storage, networking, communication, power, artificial intelligence, control, telemetry, sensing and monitoring, digital entertainment, and other types of systems, sub-systems, and/or devices. Accordingly, aspects of the present disclosure can be applied to these components in connection with a power control chain, as described herein.

During operation one central controller traditionally manages powering on and off all of the memory components of a memory sub-system, such as random access memory (RAM), via direct parallel wiring to each memory component. Depending on the size and complexity of a memory sub-system this can lead to a large number of wires extending from a single controller area to each memory component (e.g., RAM) in the system which can cause significant routing congestion. Increased wire capacitance from extending wires the long distance that can be required to reach from a central controller area to each RAM can lead to delay and charge/discharge current, which can require the addition of repeaters which consume more power and routing area. Further, a central controller and the memory components it controls often belong to different clock and/or power domains. In general, each memory component that does not belong to the same clock and/or power domain as the central controller requires level shifters and/or synchronizers to be added to convert the signal from the controller to the clock domain or power domain the memory belongs to, further increasing power and space requirements and exacerbating routing congestion.

The routing congestion can make moving memory components within, adding memory components to, or removing memory components from, a memory sub-system that utilizes a central controller directly wired to each memory component challenging. Adding or removing RAM requires controller updates, and can trigger significant re-routing in congested areas. Joining or splitting RAM or RAM blocks can require controller change, complex engineering change orders requiring significant routing changes to revise a design or cause other placement and routing issues.

In addition, depending on the size, complexity, and use case of the memory sub-system, it may not be possible to activate all memory components simultaneously. Factors such as in-rush current may require a staggered start of the memory components, which can be resource intensive for the central controller.

Aspects of the present disclosure address the above and other deficiencies by using a power control chain (PCC) system as described herein. A PCC system can include a power control chain (PCC) controller associated with a power control chain (PCC) to initiate an on or off procedure by generating a signal indicative of performance of an operation to provide power to the memory components and/or other memory sub-system components, which are referred to generally herein as "memory components," of a memory sub-system sequentially with each next memory component being activated after the passing of a set interval of time. For example, in some embodiments, a series of flip-flops can be used to provide clock signals to the memory components. For example, the flip-flops can gate a power control signal from activating each next memory component (e.g., RAM) and a clock signal pulse from a controller can be used to activate each next flip-flop at each given interval, such as at each rising edge of the clock signal pulse. In such an arrangement, as each flip-flop is activated, the power control signal can be applied to a next memory component.

By using a PCC to initiate a sequential powering, as disclosed herein, only a few wires are required to connect to the controller directly, so the central controller area can remain uncongested, and as the PCC controller only initiates the power up procedures, the power up process is not resource intensive for the PCC controller, particularly in comparison to the approaches discussed above. In addition, as each memory component must only be connected to the next memory component, the distance each wire must extend can be reduced and such shortened wires may require fewer repeaters, and take up less space and power, than traditional central control systems. Furthermore, memory components can be arranged by clock domain and/or power domain, and can therefore require fewer level shifters and/or synchronizers as compared to previous approaches, again reducing space and power consumption in comparison to such previous approaches.

Although non-limiting examples herein are generally described in terms of applicability to RAM, or other memory and storage systems and sub-systems and/or to memory devices, embodiments are not so limited, and aspects of the present disclosure can be applied to any component, partition, IP or other applications. Examples of alternative components could include components such as physical layer (PHY), phase-locked loop (PLL), voltage regulators or other components.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a power control chain (PCC) system 101. Although not shown in FIG. 1 so as to not obfuscate the drawings, the PCC system 101 can include various circuitry and/or components to facilitate determining whether a power event involving a plurality of memory components of a memory sub-system and/or components of the memory sub-system has occurred, and in response to the determination that the power event has occurred, generating signaling indicative of performance of the operation to provide power to the plurality of memory components. For example, in addition to the plurality of memory components, the PCC system 101 can include a power control chain (PCC) controller, which can generate the signaling indicative of performance of the operation to provide power to the plurality of memory components, such as by generating a power control signal. The PCC system can also include a power control chain (PCC), which can connect the PCC controller to the plurality of memory components and can sequentially apply the signaling indicative of performance of the operation to provide power to the plurality of memory components, such as a power control signal, such that the power control signal is applied to a first memory component at a first time, and applied to a second memory component at a second time subsequent to the first memory component entering a steady state. In some embodiments, the PCC system 101 can include special purpose circuitry in the form of an ASIC, FPGA, state machine, and/or other logic circuitry that can allow the PCC system 101 to orchestrate and/or perform operations to sequentially activate memory components of the memory device 130 and/or the memory device 140.

In some embodiments, the memory sub-system controller 115 includes at least a portion of the PCC system 101. For example, the memory sub-system controller 115 can include a processor 117 (processing device) configured to execute instructions stored in local memory 119 for performing the operations described herein. In some embodiments, the PCC system 101 is part of the host system 110, an application, or an operating system.

In a non-limiting example, an apparatus (e.g., the computing system 100) can include a PCC system 101. The PCC system 101 can be resident on the memory sub-system 110. As used herein, the term "resident on" refers to something that is physically located on a particular component. For example, the PCC system 101 being "resident on" the memory sub-system 110 refers to a condition in which the hardware circuitry that comprises the PCC system 101 is physically located on the memory sub-system 110. The term "resident on" can be used interchangeably with other terms such as "physically arranged on," "deployed on" or "located on," herein.

In some embodiments, the PCC system 101 comprises a power control chain (PCC) controller (e.g., PCC controller 214), which can include a power controller (e.g., power controller 252) and a clock controller (e.g., clock controller 254), which can be coupled to a plurality of memory components. The plurality of memory components can be coupled to one another via a power control line (e.g., power control line 321). The power controller can be configured to determine that a power event has occurred. As described above, the plurality of memory components can be memory dice or memory packages that form at least a portion of the memory device 130. As described herein a power event can be an event involving the transition from a first power state to a second power state, such as an input indicating a transition should be made from a first power state to a second power state. As described herein, a power state can indicate a level of power consumption, and/or computing activity, by a system or device. For example, a power state could be represented by an Advanced Configuration and Power Interface (ACPI) power state such as a global "G" state (e.g., G-states G0-G3, where: G0 is a "working" state; G1 is "sleeping" state; G2 is a "soft off" state; and G3 is a "mechanical off" state), or a sleep "S" state (e.g., S-states S0-S5, where: S0 is a "working" state; S0ix is a "modern standby" state, or "low power S0 idle" state; S1 is a "Power on Suspend" state; S2 is a "CPU powered off" state; S3 is a "standby" state, a "sleep" state, or a "Suspend to Ram" state; S4 is a "hibernation" state or a "Suspend to Disk" state; and S5 is a "soft off" state). Examples of power states can also include device "D" states (e.g., D-states D0-D3, where: D0 can be a "fully on" state or the operating state; D1 and D2 can be intermediate power states; and where D3 can divided into a D2 Hot state in which a device has auxiliary power, and a D3 Cold state in which no power is provided to the device.), processor (CPU) "C" states (e.g., C-states C0-C3, where: C0 can be the operating state; C1 can be a "Halt" state; C2 can be a "stop-clock" state; C3 can be a "Sleep" state), or a performance "P" state (e.g., P-states P0 to Pn, where "n" is no greater than 16 and where: P0 can be the highest performance state with maximum power and frequency, and P1 to Pn can be successively lower-performance states with scaled voltage and frequency), or other suitable power state as will be appreciate. As used herein, the number of a power state is inversely related to power consumption and/or performance, such that a "zero" state indicates the highest power consumption and/or performance, and successively higher numbers indicate successively lower power consumption and/or performance (e.g., P1 consumes less power than P0, P2 consumes less power than P1, P3 consumes less power than P2, etc.). In some examples the power event can be a power up event in which the transition from a first power state to a second power state includes a transition from a state of lower power consumption and/or performance to a state of higher power consumptions and/or performance (e.g., a power up event can be a change from a S3 sleep state to a S0 working state). In some examples, the power event can be a power down event in which the transition from the first power state to the second power state includes a transition from a state of higher power consumption and/or performance to a state of lower power consumption and/or performance (e.g., a power down event can be a change from a S0 working state to a S4 hibernation state).

The PCC system 101 can be further configured to apply signaling indicative of a power event involving the memory sub-system 110 and the plurality of memory components, and, hence, to cause the PCC system 101 to sequentially apply a power control signal generated by the power controller to each of the memory components via the power control line (e.g., power control line 321). The power control signal applied by the PCC system 101 can include multiple bits that can correspond to various power states, such as: S0-S5; P0-P16; or other power state that can represent, for example, a "functional" power state, a "light sleep" power state, a "deep sleep" power state, and a "shut down" power state (e.g., a control vector value represented by binary numbering could be 00 for a "shut down" power state, 01 for a "functional" power state, 11 for a "light sleep" power state, 10 for a "deep sleep" power state, etc.). As described above, the PCC system 101 can also include a power control chain (PCC) (e.g., PCC 268 in FIG. 2) which can include a number of power control chain (PCC) components (e.g., PCC components 220 in FIG. 2) such as flip-flops, level shifters, and clock synchronizers (e.g., clock synchronizer 364 in FIG. 3C) that may also receive the applied signaling, as described in more detail herein. A clock synchronizer (e.g., clock synchronizer 364 in FIG. 3C) can be a synchronizing clock shaper which "shortens" the clock signal when crossing from a slow to a fast clock domain, or a synchronizing clock expander, which "extends" or "lengthens" the clock signal when crossing from a fast to a slow clock domain.

In some embodiments, the PCC system 101 can apply the power control signal (or cause the power control signal to be applied) such that the power control signal is applied to a first memory component among the memory components at a first rising edge of a clock signal pulse generated by the clock controller and/or one of the flip-flops and applied to a second memory component among the plurality of memory components at a second rising edge of a clock signal pulse generated by the clock controller and/or one of the flip-flops. In some embodiments, the first rising edge of the clock signal pulse activates a first flip-flop, applying the power control signal to the first memory component, and the second rising edge of the clock signal activates a second flip-flop, applying the power control signal to a second memory component, although embodiments are not limited to architectures that solely include edge triggered flip-flops.

In some embodiments the signaling indicative of performance of the operation to provide power can include application of a power control signal associated with a first power domain and a clock signal associated with a first clock domain. That is, in some embodiments, the power control circuitry and at least one of the memory components can be in a same (e.g., first) power domain and/or in a same (e.g., first) clock domain. In such embodiments, the signaling to provide power to at least one memory component can be provided without the need for a level shifter or other circuitry to allow for cross domain signal application.

Figure 2:
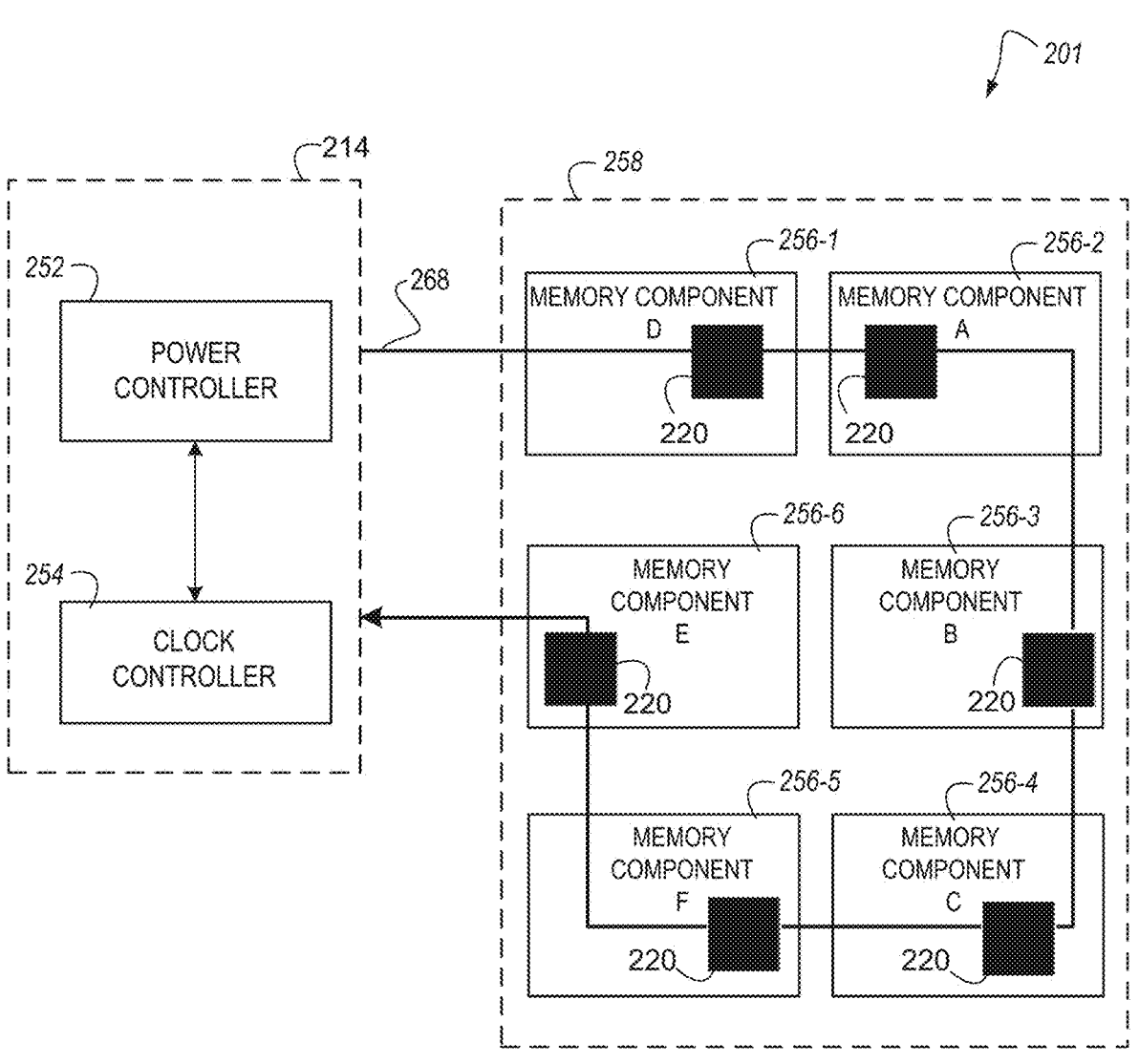
FIG. 2 is a flow diagram corresponding to a memory sub-system power control chain in accordance with some embodiments of the present disclosure.

In some embodiments, the PCC system 101 can control the application of the power control signal to the plurality of memory components based on the clock signal using a power control chain (PCC) (e.g., PCC 268 as shown in FIG. 2) coupled to the plurality of memory components. As described in more detail in connection with FIG. 2, herein, the PCC can include various PCC components (e.g., PCC components 220 in FIG. 2) that are configured to facilitate application of a power control signal to the various memory components of the memory sub-system 110.

In some embodiments, the PCC system 101 can determine that each of the plurality of memory components are in a power on steady state and discontinue the application of a clock signal pulse associated with performance of the operation to provide power to the plurality of memory components responsive to the determination to reduce an amount of power consumed by the memory sub-system. Embodiments are not so limited, however, and in some embodiments, the PCC system 101 can control application of clock signal pulses (e.g., as applied by the flip-flops or other timing circuitry) such that once a particular memory component is in a power on steady state clock signal pulses are no longer provided to that particular memory component. Similarly, once a next memory component (e.g., a memory component that is powered on subsequent to the particular memory component being powered on) is in a power on steady state, application of clock signal pulses can be ceased to that memory component and so on and so forth.

In some embodiments, the PCC system 101 can determine that a power-down event involving the plurality of memory components of the memory sub-system has occurred. In response to the determination that the power-down event has occurred, the power control circuitry 101 can generate signaling indicative of performance of an operation to stop providing power to the plurality of memory components. The signaling indicative of performance of the operation to stop providing power to the plurality of memory components can be sequentially applied to each of the memory components (e.g., in a same order or an opposite order as the power control signal(s) were applied to the memory components to power on the memory components) such that the power control signal is applied to the first memory component among the plurality of memory components at a first time and applied to the second memory component among the plurality of memory components at a second time.

Figure 3A:
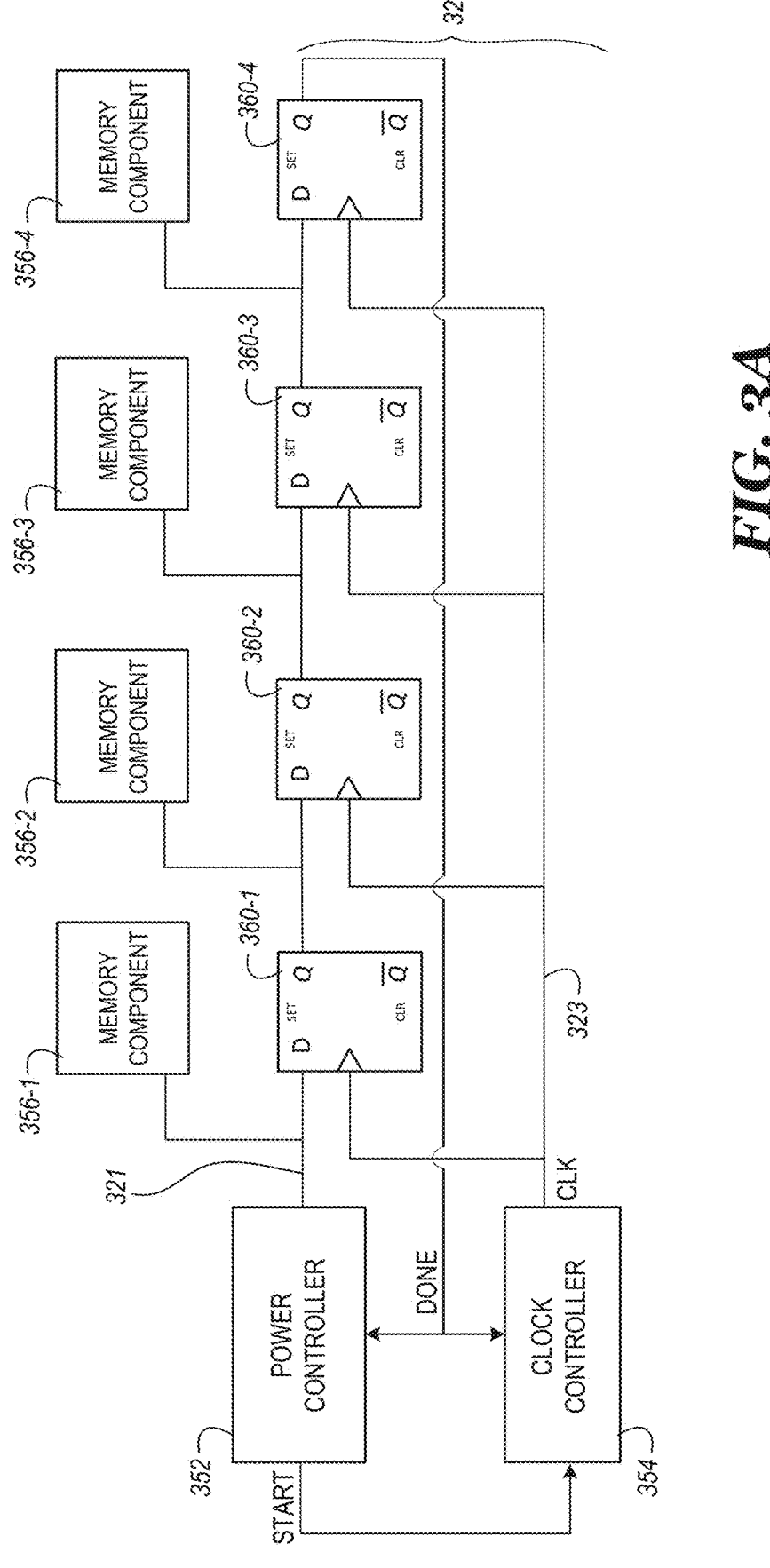
FIG. 3A is a block diagram of an example computer system in which embodiments of the present disclosure may operate.

In a non-limiting example, an apparatus (e.g., the memory sub-system 110) can include a plurality of memory components (e.g., memory components 256 as shown in FIG. 2) coupled to one another via a power control chain (PCC) (e.g., PCC 268 as shown in FIG. 2), which can include a power control line (e.g., power control line 321 as shown in FIG. 3A) and a clock network, (e.g., Clock network 324 as shown in FIG. 3A). The PCC system 101 can include a power controller and a clock controller coupled to the plurality of memory components, and the power controller can be configured to determine that a power event involving the plurality of memory components has occurred. The power controller can apply signaling indicative of a power event involving the plurality of memory components. That is, the PCC system 101 can sequentially apply a power control signal generated by the power controller to each of the memory components, via the power control line (e.g., power control line 321 as shown in FIG. 3A), such that a power control signal is applied to a first memory component (e.g., memory component 356-1 in FIG. 3A) among the plurality of memory components at a first rising edge of a clock signal generated by the clock controller and/or one of the flip-flops, and the power control signal is applied to a second memory component (e.g., memory component 356-2 in FIG. 3A) among the plurality of memory components at a second rising edge of the clock signal generated by the clock controller and/or one of the flip-flops.

In some embodiments, a first subset of the plurality of memory components (e.g., memory component area cluster 366-1 in FIG. 3D) are physically arranged within a memory sub-system 110 such that the first subset of the plurality of memory components are associated with a first power domain or a first clock domain, or both, and a second subset of the plurality of memory components (e.g., memory component area cluster 366-2) are physically arranged within the memory sub-system 110 such that the second subset of the plurality of memory components are associated with a second power domain or a second clock domain, or both. Embodiments are not so limited, however, and the memory components can be grouped into subsets having different quantities of memory components associated therewith.

In some embodiments, the signaling indicative of performance of the operation to provide power can include a power control signal and a clock signal pulse. In such embodiments, the power control signal can be associated with a first power domain and the clock signal can be associated with a first clock domain, although embodiments are not so limited.

As discussed in more detail herein, some embodiments can include a plurality of PCC components (e.g., PCC components 220 in FIG. 2). For example, a memory component among the plurality of memory components can be associated with a second power domain and a PCC component of the plurality of PCC components can comprise a level shifter (e.g., 362 in FIG. 3C). As will be appreciated, a level shifter can be configured to change the power domain of the power control signal and the power domain of the clock signal, from the first power domain to the second power domain. Embodiments are not so limited, however, and in some embodiments, a PCC component of the plurality of PCC components can comprise a clock synchronizer, such as a synchronizing clock shaper (e.g., clock synchronizer 364 in FIG. 3C). As will be appreciated, the clock synchronizer 364 can be configured to change the clock domain of the clock signal from the first clock domain to the second clock domain.

In some embodiments, at least one memory component 356 among the plurality of memory components 356 comprises random access memory or flash memory. For example, at least one of the memory components 356 can be a RAM, SRAM, cache, memory array, or the like.

Figure 3B:
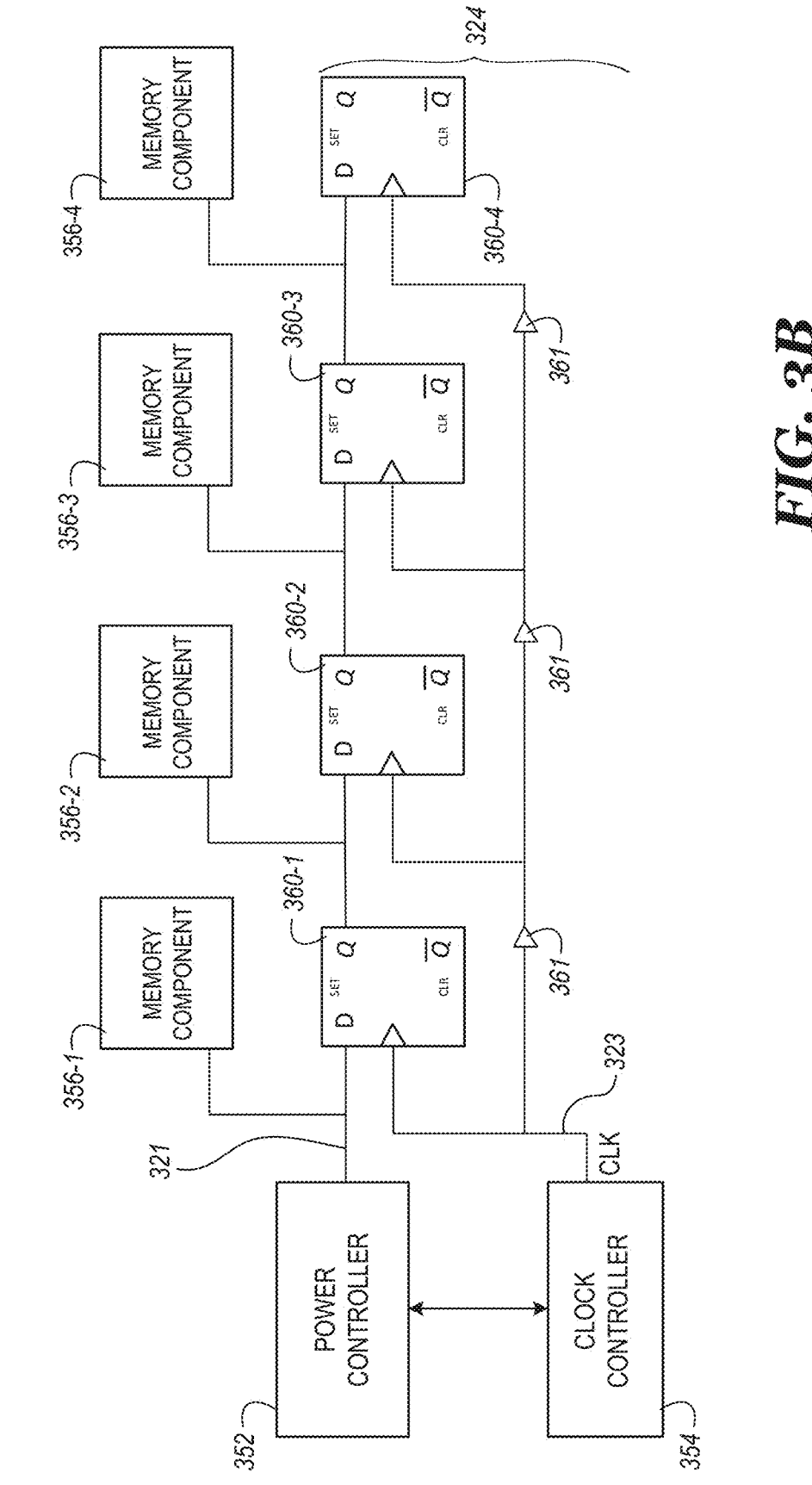
FIG. 3B is another block diagram of an example computer system in which embodiments of the present disclosure may operate.
Figure 3C:
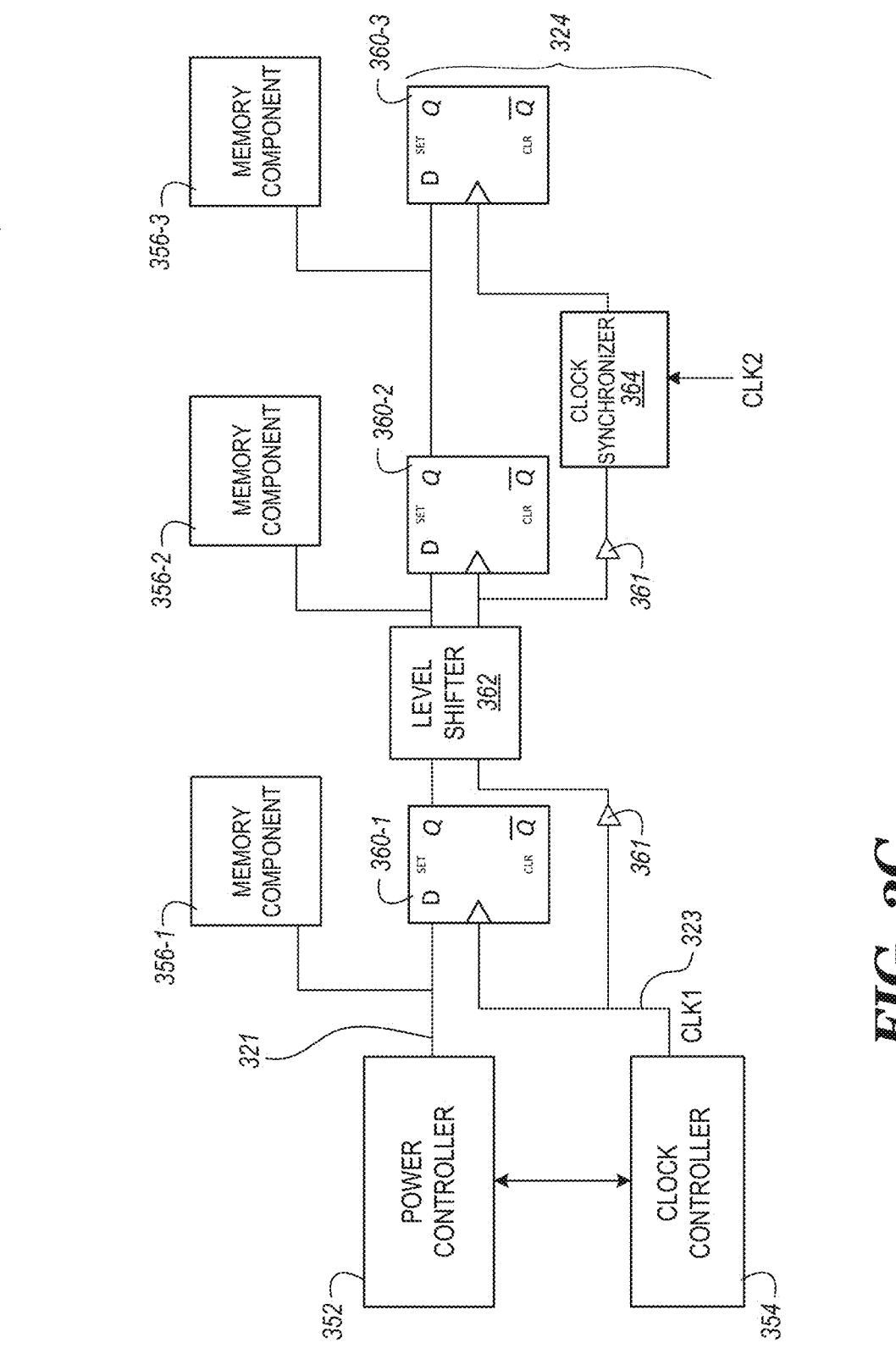
FIG. 3C is yet another block diagram of an example computer system in which embodiments of the present disclosure may operate.
Figure 3D:
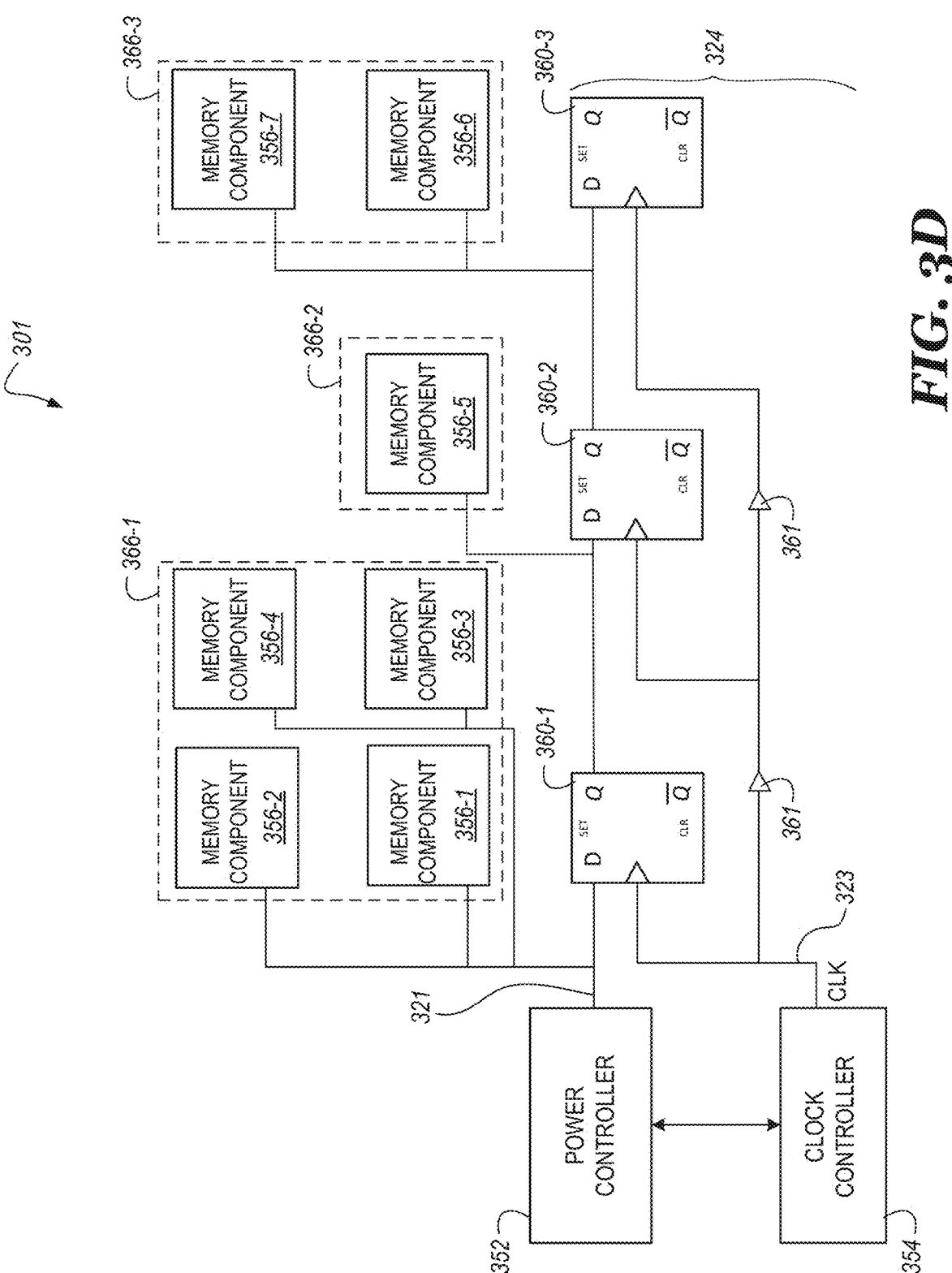
FIG. 3D is yet another block diagram of an example computer system in which embodiments of the present disclosure may operate.
Figure 3E:
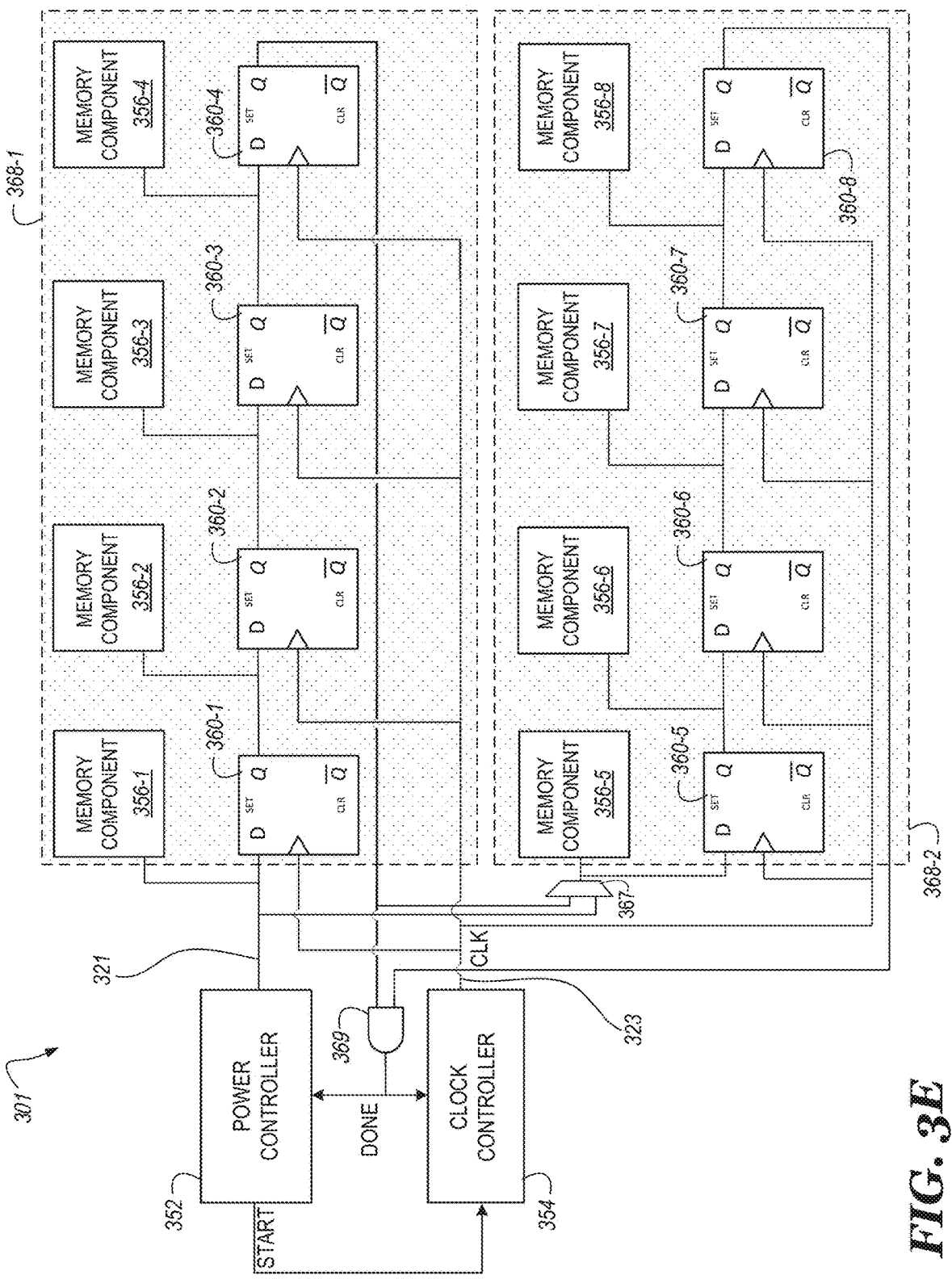
FIG. 3E is yet another block diagram of an example computer system in which embodiments of the present disclosure may operate.

In a non-limiting example, a PCC system (e.g., PCC system 301 in FIG. 3E) can include a first power control chain (PCC) (e.g., first PCC 368-1 in FIG. 3E). The first PCC can include a plurality of memory components (e.g., memory components 356 in FIG. 3E) arranged in series and separated by a plurality of PCC components (e.g., PCC components 220 in FIG. 2) and a first power control line (e.g., power control line 321 in FIG. 3E) coupling the plurality of memory components and the plurality of PCC components to one another. The PCC system can further include a power controller (e.g., power controller 352 in FIG. 3E) coupled to the first power control chain and configured to generate a power control signal. The PCC system can also include a clock controller (e.g., clock controller 354 in FIG. 3E) coupled to the plurality of PCC components of the first PCC and configured to generate clock signal pulses at set intervals. The PCC system can further include a processing device (e.g., the PCC system 101, the memory sub-system 115, etc.) coupled to a PCC controller (e.g., PCC controller 214 in FIG. 2) which can include the power controller and the clock controller. Continuing with this non-limiting example, the PCC controller is configured to determine a power event criterion has been met and based on the determination that the power event criterion has been met, cause the power controller to generate the power control signal to the first PCC.

Based on the determination that the power event criterion has been met, the PCC controller can cause the clock controller 354 to generate clock signal pulses to the plurality of PCC components (e.g., PCC components 220 in FIG. 2), which can include a power control line and a clock network, of the first PCC and cause a first memory component (e.g., memory component 356-1) to change power state based on receiving the power control signal. The PCC controller can further cause a first PCC component such as a first flip-flop (e.g., flip-flop 360-1 in FIG. 3C), a level shifter (e.g., level shifter 362 in FIG. 3C), synchronizer (e.g., clock synchronizer 364 in FIG. 3C), etc., to activate after the set interval based on receiving a first clock signal pulse from the clock controller. The controller can further cause a second memory component (e.g., memory component 356-2) to change power state based on receiving the power control signal due to the activation of the first PCC component and/or a second flip-flop (e.g., flip-flop 360-2) and cause any subsequent PCC components or memory components to activate sequentially. In this example, each activation is separated by a set time interval, although embodiments are not limited to utilization of static time intervals. The controller can also cause any additional memory components to change power state based on receiving the power control signal due to the activation of the subsequent PCC components. In some embodiments, the power event criterion is the occurrence of a power event involving a plurality of memory components of a memory sub-system 110.

As mentioned above, one or more PCC components (e.g., PCC components 220 in FIG. 2) of the plurality of PCC components can be a level shifter configured to change a power domain of the power control signal and a power domain of the clock signal. In addition to, or in the alternative, in some embodiments, one or more PCC components of the plurality of PCC components can be a synchronizing clock expander (e.g., clock synchronizer 364 in FIG. 3C) configured to change the clock signal pulses from a first clock domain to a second clock domain.

In some embodiments, one or more PCC components (e.g., PCC components 220 in FIG. 2) of the plurality of PCC components can be a flip-flop that can be configured to cause a memory component to receive a power control signal based on the flip-flip receiving a clock signal pulse. In some embodiments, activating a PCC component causes a plurality of memory components to receive the power control signal. In some embodiments, one or more memory component can be a memory component area cluster (e.g., memory component area cluster 366 in FIG. 3D).

Some embodiments can include a second PCC (e.g., PCC 368-2 in FIG. 3E) coupled to the power controller. The second PCC can include a second plurality of memory components (e.g., memory components 356-5 to 356-8 in FIG. 3E) arranged in series and separated by a second plurality of PCC components (e.g., flip-flops 360-5 to 360-8 in FIG. 3E). The second plurality of PCC components are coupled to the clock controller and the power control line, which is coupled to the second plurality of memory components via a multiplexor 367. In these embodiments, based on the determination that the power event criterion has been met, the PCC controller is configured to cause the power controller to also generate the power control signal to the second PCC and cause the clock controller to also generate clock signal pulses to the second plurality of PCC components of the second PCC 368-2.

The controller is further configured to cause a first memory component (e.g. memory component 356-5 in FIG. 3E) of the second plurality of memory components to change power state based on receiving the power control signal, cause a first PCC component of the second plurality of PCC components to activate after the set interval based on receiving a first clock signal pulse from the clock controller, and cause a second memory component (e.g., memory component 356-6 in FIG. 3E) of the second plurality of memory components to change power state based on receiving the power control signal due to the activation of the first PCC component of the second plurality of PCC components. The controller may be further configured to cause any subsequent PCC components of the second plurality of PCC components to activate sequentially. As mentioned above, each activation can be separated by the set interval. Further, the controller can cause any additional memory components of the second plurality of memory components to change power state based on receiving the power control signal due to the activation of the subsequent PCC components of the second plurality of control logic components.

FIG. 2 illustrates an example of a power control chain (PCC) system 201 in accordance with some embodiments of the present disclosure. The example PCC system 201, which can be referred to in the alternative as a "system" or as an "apparatus," can be analogous to the PCC system 101 in FIG. 1. The example PCC system 201 can include a power control chain (PCC) controller 214, a power control chain (PCC) 268, and a plurality of memory components 256-1, 256-2, 256-3, 256-4, 256-5, 256-6 (which can be generically or collectively referred to as memory component(s) 256) which can be located on a circuit area 258 (e.g., a die, a circuit portion area, etc.). The PCC controller 214 can include a power controller 252, and a clock controller 254. The PCC 268 can include a number of PCC components 220 such as a power control line (e.g., power control line 321 in FIG. 3A), a clock network (e.g., clock network 324 in FIG. 3A), and/or level shifters (e.g., level shifter 362 in FIG. 3C). The clock network can also contain a number of clock network components such as a clock signal line (e.g., clock signal line 323 in FIG. 3A), a flip-flop ((e.g., flip-flops 360 in FIG. 3A), and/or a clock synchronizer (e.g., a synchronizing clock shaper 364 in FIG. 3C). As the clock network is a component of the PCC, these clock network components can also be referred to as PCC components 220). The PCC components 220 (e.g., flip-flop 360, level shifter 362, etc.) can be located in the circuit area 258. In the example of FIG. 2 the PCC 268 can connect the PCC controller 214 to the plurality of memory components 256 located in the circuit area 258, and applies a power control signal generated by the PCC controller 214 to the plurality of memory components 256.

In FIG. 2, the PCC system 201 can include a circuit area 258 that includes a number of memory components 256 (e.g., memory components A-F) that have power supplied thereto via voltage supply lines coupled to the PCC, the power supply controlled by the power controller 252 of the PCC controller 214. The memory components 256 can be logic blocks that can include various hardware that form one or more cores (e.g., "intellectual property (IP) cores"). As used herein, a "core" or "IP core" generally refers to one or more blocks of data and/or logic that form constituent components of an application-specific integrated circuit or field-programmable gate array. The memory components can be designed, built, and/or otherwise configured to perform specific tasks and/or functions within the systems described herein. In some embodiments, the memory components 256 include memory devices, such as RAM components and/or NAND memory dice. In some embodiments, the PCC controller 214 and/or the PCC 268 can take an action (or cause an action to be taken) to track, limit, adjust or manipulate the power control signals applied via the power control line of the PCC 268 to the voltage supply lines coupled to the PCC 268 to provide voltage manipulation to the memory components 256.

As shown in FIG. 2, the system 201 can be coupled to one or more computing components. The computing components are generally external to the PCC system 201 (i.e., the computing components are physically distinct from a chip, such a PCC that, at minimum, the PCC system 201 is deployed on) but are communicatively couplable to the PCC system 201 such that signaling can be exchanged between the PCC system 201 and the computing components. Non-limiting examples of the computing components can include controllers, memory devices, graphics processing units, processors/co-processors, and/or logic blocks, among others that are deployed on a memory sub-system (e.g., the memory sub-system 110 illustrated in FIG. 1, herein) in which the system 201 operates.

The PCC can include a power control line (e.g., power control line 321 in FIG. 3A) which can be, for example, a rail to provide a "power control signal" to one or more electrical components, such as the memory components 256. The power control line can be split into one or more power control lines that control the application of a voltage supply to the memory components 256 of the system 201.

FIG. 3A is a block diagram of an example computer system in which embodiments of the present disclosure may operate. For example, FIG. 3A is a diagram of a power control chain (PCC) system 301, which can be analogous to PCC system 101 and PCC system 201 of FIG. 1 and FIG. 2, configured to stagger power up or shut down of a plurality of memory components 356-1, 356-2, 356-3, 356-4 (generically or collectively referred to as memory component(s) 356) in accordance with some embodiments of the present disclosure. In some embodiments the PCC system 301 can include a plurality of memory components 356, such as a plurality of RAM, NAND, or other memory components, coupled to one another via a power control line 321. The PCC system 301 can also include a power controller 352 and a clock controller 354, which can be coupled to the plurality of memory components 356 by the power control line 321 and/or by other communication paths or traces not explicitly illustrated in FIG. 3A. In some configurations, such as in the PCC system 301 shown in FIG. 3A can be configured with a centralized clocking scheme (as opposed to the source synchronous clocking scheme as will be shown in FIG. 3B).

In some embodiments, the PCC system 301, which can be analogous to the PCC system 101/201 of FIG. 1 and FIG. 2, can determine that a power event involving the plurality of memory components 356 has occurred and can receive signaling indicative of the power event, such as a power control signal. The signaling received by the PCC system 301 can be generated by an external device, such as the host system 120 of FIG. 1, and/or can be in response to a change in power state such as a power up or power down involving a computing system in which the PCC system 301 is deployed. In response to the signaling indicative of the power event, the PCC system 301 can cause the power controller 352 to generate a power control signal to the power control line 321 and/or cause the clock controller 354 to generate a clock signal pulse to the clock signal line 323 of the clock network 324. Accordingly, the signaling indicative of the power event can be applied to cause the PCC system 301 to sequentially apply a power control signal to each of the memory components 356 via the power control line 321 at intervals which can be controlled via the clock network 324.

In some embodiments after the power control signal is applied to a final memory component 356 (e.g., memory component 356-4) a "done" signal can be sent through the clock network 324 to cause the power controller 352 to determine that each of the plurality of memory components 356 are in a power steady state and cause the clock controller 354 to discontinue production of the clock signal pulses to reduce the amount of power consumed by the PCC system 301. In some embodiments neither the clock controller 354 nor the power controller 352 is aware of a total number of memory components 356 in the PCC system 301. That is, in some embodiments, it is unnecessary for the PCC controller (e.g., PCC controller 214 in FIG. 2) of the PCC system 301 (and hence, the power controller 352 and the clock controller 354, which are part of the PCC controller) to have information regarding the quantity of memory components 356. Instead, the power control signal and clock signals are propagated until the "done" signal 324 is received thereby indicating that all the memory components 356 have changed power state and reached a steady state at the new power state.

In some embodiments, the power control signal is applied to a first memory component 356-1 among the plurality of memory components 356 at a first rising edge of a clock signal pulse generated by the clock controller 354 (or a clock signal generated by one of the flip-flops 360) and applied by via the clock signal line 323, and the power control signal is then applied to a second memory component 356-2 at a second rising edge of the clock signal generated by the clock controller 354. In some embodiments the PCC system 301 includes one or more flip-flops 360-1 to 360-4 (referred to generally as "flip-flops 360," herein) to cause a memory component 356 to receive the power control signal through the power control line 321 based on the flip-flop 360 receiving a clock signal pulse through the clock signal line 323. For example, the second memory component 356-2 receives the power control signal via the power signal line 321 when the first flip-flop 360-1 receives the first rising edge of the clock signal pulses, the memory component 356-3 receives the power control signal through the power control line 321 when the second flip-flop 360-2 receives the second rising edge of the clock signal pulse through clock signal line 323, etc.

In some embodiments the time between clock signal pulses may be assigned with a margin to account for any differences in time needed for each memory component to reach a power steady state, such as a steady current state, which can depend on many factors such as temperature, process, voltage, type of memory component, or other factors. The clock controller 354 may generate single clock pulses that are spaced far enough apart to allow any memory component 356 to reach steady state, and at each next clock signal pulse the next memory component 356 in the PCC system 301 can start up or shut down.

FIG. 3B is another block diagram of an example computer system in which embodiments of the present disclosure may operate. For example, FIG. 3B is a diagram of a power control chain (PCC) system configured to stagger power up or shut down of a plurality of memory components 356 in accordance with some embodiments of the present disclosure. The PCC system 301 can be analogous to the PCC system 101/201 of FIG. 1 and FIG. 2. In contrast to FIG. 3A, FIG. 3B shows an example of a PCC system 301 configured to use source synchronous chain clocking, which can reduce routing and area resources. In some embodiments, the power control chain (PCC) components (e.g., PCC component 220 in FIG. 2), as represented by the flip-flops 360 in FIG. 3B, can be circuitry within the memory components 356. As such, the PCC components (e.g., PCC components 220 in FIG. 2) can be distant from each other on a die (e.g., a memory component 356). For example, a flip-flop 360-1 can be located on a memory component 356-1 which can be distant from a second flip-flop 360-2 located on a second memory component 356-2, and therefore keeping all of the flip-flops 360 synchronous can require excessive clock routing resources. In some embodiments a source synchronous scheme may allow the clock signal line 323, transmitting a clock signal pulse, to travel with the power control line 321 (e.g., as a bundle) between PCC components such as flip-flops 360 on memory components 356, which may save clock routing resources as compared to a centralized clock sourcing scheme. For example, the clock signal line 323 and the power control line 321 can travel as a bundle from a first-flop 360-1 on a memory component 356-1 to a second flip-flop 360-2 on a second memory component 356-2, and then travel as a bundle from the second flip-flop 360-2 to a third flip-flop 360-3 on a third memory component 356-3. In some embodiments, such as the source synchronous example shown in FIG. 3B, can have a buffer 361 (e.g., a buffer gate) to align the propagation of the clock signal via the clock signal line 323 to the appropriate power control accompanied by the clock signal pulse. (i.e., the power control signal that travels via the power control line 321 from output Q of flip-flop 360-1 to input D of flip-flop 360-2.) In some embodiments the PCC system 301 is unidirectional which can prevent a race condition and reduce risk of timing anomalies. As used herein, a "race condition" generally refers to a condition of an electronics, software, or other system where substantive behavior of the system is dependent on the sequence or timing of other uncontrollable events. It becomes a bug when one or more of the possible behaviors is undesirable. An example of a race condition may occur when a logic gate combines signals that have traveled along different paths from the same source. The inputs to the gate can change at slightly different times in response to a change in the source signal. The output may, for a brief period, change to an unwanted state before settling back to the designed state. Certain systems can tolerate such glitches but if this output functions as a clock signal for further systems that contain memory, for example, the system can rapidly depart from its designed behavior. Timing anomalies generally refer to scenarios in which an expected clock signal is not received at the expected time and/or scenarios in which a race condition leads to a clock edge not occurring at the expected time.

FIG. 3C is yet another block diagram of an example computer system in which embodiments of the present disclosure may operate. For example, FIG. 3B is a diagram of a power control chain (PCC) system 301 configured to stagger power up or shut down of a plurality of memory components 356 in accordance with some embodiments of the present disclosure. The PCC system 301 can be analogous to the PCC system 101/201 of FIG. 1 and FIG. 2. The PCC system 301 in FIG. 3C shows a PCC system 301 configured to use source synchronous chain clocking. The source synchronous chain clocking can be analogous to that shown in FIG. 3B. In some embodiments, signaling indicative of performance of an operation to provide power to the memory components 356 can include generation of a power control signal associated with a first power domain, and a clock signal associated with the first clock domain and/or generation of a power control signal associated with a second power domain, and a clock signal associated with the second clock domain. For example, a memory component 356, (e.g., memory components 356-2 and 356-3) can be associated with a second power domain, and the power control circuitry 313 can include a level shifter 362 configured to perform a power domain crossing such as by changing the power domain of the power control signal and the power domain of the clock signal 323, from the first power domain to the second power domain prior to application of the power control signal to the memory components 256 in the second power domain.

Similarly, in some embodiments a memory component 356 (e.g., the memory component 356-4 (not shown)) or a power control chain (PCC) component (e.g., flip-flop 360-3) can be associated with a second clock domain, and the PCC system 301 can include a synchronizing clock shaper 364 configured to perform a clock crossing from the first clock domain to a second clock domain. In some embodiments, the second clock domain can be "faster" (e.g., can operate according to a higher clocking frequency) than the first clock domain. This can occur, for example, during a clock crossing between RAM logic where it may be necessary to change the clock domain of the clock signal from the first clock domain to the second clock domain. In some embodiments, the PCC system 301 can include a synchronizing clock expander (e.g., clock synchronizer 364) to perform a clock crossing from a first clock domain to a second clock domain that is slower than the first clock domain. In some embodiments, the memory components 356 are physically arranged and activated in an order to minimize the total number of level shifters 362 required and to avoid crossing from a faster clock domain to a slower clock domain to facilitate the use of synchronizing clock shapers 364 over more complex synchronizing clock expanders. However, clock synchronizers 365 may not be required if clock pulses are spaced far enough apart for data to be stable at the next flip-flop 360 input. In some embodiments, the PCC system 301 can have a buffer 361 (e.g., a buffer gate) to align the propagation of the clock signal via the clock signal line 323 to the appropriate power control accompanied by the clock signal pulse. In some embodiments, the clock signal pulse may travel via a clock signal line 323 through a level shifter 362 without changing the clocking scheme.

FIG. 3D is yet another block diagram of an example computer system in which embodiments of the present disclosure may operate. For example, FIG. 3D is a diagram of a power control chain (PCC) system 301 configured to stagger power up or shut down of a plurality of memory component 356 in accordance with some embodiments of the present disclosure. The PCC system can be analogous to the PCC system 101/201 of FIG. 1 and FIG. 2. The PCC system 301 in FIG. 3D shows a PCC system 301 configured to use source synchronous chain clocking. The source synchronous chain clocking can be analogous to that shown in FIG. 3B and FIG. 3C. FIG. 3D shows a PCC system 301, which can include one or more memory component area clusters 366-1, 366-2, to 366-3 (referred to generally as "memory component area clusters 366," herein), such as a memory component area cluster 366, where each memory component area cluster 366 can include one or more memory component 356 which can be controlled as a group. In some embodiments, grouping the memory components 356 into memory component area clusters 366 can accommodate latency requirements that may be experienced by subsets or groups of the memory components 356. In the example illustrated in FIG. 3D, a single flip-flop 360 (e.g., 360-2) can control several memory components 356 (e.g., memory component 356-6 and memory component 356-7) contained in a single memory component area cluster 366 (e.g., memory component area cluster 366-3). In some embodiments, memory components 356 can be physically arranged into memory component area clusters 366 on a die based on the memory components 356 in each memory component area cluster 366 being associated with the same power domain, clock domain, or both. In some embodiments, the PCC system 301 can have a buffer 361 (e.g., a buffer gate) to align the propagation of the clock signal via the clock signal line 323 to the appropriate power control accompanied by the clock signal pulse.

FIG. 3E is yet another block diagram of an example computer system in which embodiments of the present disclosure may operate. For example, FIG. 3E is a diagram of power a power control chain (PCC) system 301 configured to stagger power up or shut down of a plurality of memory components 356 in accordance with some embodiments of the present disclosure. The PCC system 301 can be analogous to the PCC system 101/201 of FIG. 1 and FIG. 2. The PCC system 301 in FIG. 3E shows a PCC system 301 configured to use a centralized clocking scheme analogous to the centralized clocking scheme as shown in FIG. 3A, which can be preferable for small areas. FIG. 3E shows a PCC system which can include a first power control chain (PCC) 368-1 and a second PCC 368-2 in parallel, which can have less latency as compared to multiple PCCs 368 that are provided in series or a single PCC 368 of a length to control the number of memory components 356 contained in the multiple parallel PCCs 368-1, 368-2. In some embodiments, a PCC 368 can include a plurality of memory components 356 arranged in series and separated by a plurality of power control chain (PCC) components, and a power control line 321 coupling the plurality of memory components 356 and the plurality of PCC components (e.g., PCC components 220 in FIG. 2) to one another. In some embodiments a power controller 352 generates a power control signal, via the power control line 321, to both the first PCC 368-1 (directly) and the second PCC 368-2 (via a multiplexor 367). In some embodiments a clock controller 354 generates clock signal pulses at set intervals to both the first PCC 368-1 and the second PCC 368-2. Embodiments of the present disclosure are not limited to a first PCC 368-1 and a second PCC 368-2. Some embodiments of the PCC system 301 can include three or more PCCs 368.

In some embodiments a power control signal can be applied to two or more PCCs 368 in parallel or sequentially via the power control line 321. Whether applied in parallel or sequentially may depend on the inputs and control of the multiplexor 367. In some embodiments, each PCC 368 can be configured separately for power up or power down. For example, PCC 368-1 and PCC 368-2 can be powered down or slept in parallel and powered up sequentially or vice versa, among other possibilities. In some embodiments, one or more gates, such as an AND gate 369, can be used to independently complete the operation of PCCs 368 of various lengths. In some embodiments, the clock signal can be gated from a PCC 368 that completes a change of power state earlier than other PCCs 368.

FIG. 4 is flow diagram corresponding to a method 470 for memory sub-system power control in accordance with some embodiments of the present disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 470 is performed by the PCC system 101 of FIG. 1, the memory sub-system controller 115, and/or the processor 117. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 472, an occurrence of a power event involving a memory sub-system can be determined. The power event can correspond to the starting (or recovering from a sleep state) of a computing system whereby the various memory devices (e.g., memory components) of a memory sub-system of the computer must be powered on. As discussed above, the occurrence of the power event can be determined by a processing device (e.g., the PCC system 101) in response to signaling received from a host system 120 in response to the host system 120 powering on or initializing from a sleep state (e.g., a S1-S5 system sleep state). In some embodiments, the memory sub-system can be analogous to the memory sub-system 110 illustrated in FIG. 1. As described above, the memory components can be memory dice or memory packages that are coupled to one another to create an array of memory cells, such as a RAM, a three-dimensional stackable cross-gridded array of memory cells used by the memory sub-system to store data, or other suitable memory component(s).

At operation 474, in response to the determination that the power event has occurred, signaling indicative of performance of an operation can be generated. For instance, the signaling can be generated to provide a power control signal (e.g., power control signal applied via power control line 321 of FIGS. 3A-3E) to a plurality of memory components (e.g., the memory components 256/356 of FIG. 2 and FIGS. 3A-3E) of the memory sub-system. In some embodiments, the signaling indicative of performance of the operation to provide power to the plurality of memory components can be sequentially applied to each of the memory components such that a first memory component is power up followed by powering up of a second memory component, and so forth. In some embodiments, the signaling indicative of performance of the operation to provide power can include application of a power control signal associated with a first power domain and a clock signal associated with a first clock domain.

At operation 476, the power control signal can be applied to a first memory component among the plurality of memory components at a first time. For example, during a first time period, a first memory component can receive a power control signal and/or a clock signal while other memory components are not receiving a power control signal and/or a clock signal. Once the first memory component has entered a steady state power on mode of operation, at operation 478, the power control signal can be applied to a second memory component among the plurality of memory components at a second time such that the power control signal is applied to the second memory component subsequent to the first memory component entering a steady state. This process can be repeated until each of the memory components has been powered on to the steady state mode of operation.

In some embodiments, the method 470 can include controlling the application of the power control signal to the plurality of memory components based on the clock signal using a power control chain (PCC) system (e.g., PCC system 101/201/301 of FIG. 1, FIG. 2, and FIGS. 3A-3E) coupled to the plurality of memory components, as discussed above in connection with FIGS. 3A-3E. In some embodiments, the method 470 can include determining that each of the plurality of memory components are in a power on steady state and discontinuing application of a clock signal associated with performance of the operation to provide power to the plurality of memory components responsive to the determination. By discontinuing application of the clock signal to memory components that are powered on, an amount of power consumed by the memory sub-system is reduced in comparison to approaches that do not discontinue application of such signals under these conditions.

In some embodiments, the method 470 can include determining that a power-down event involving the plurality of memory components of the memory sub-system has occurred. In response to the determination that the power-down event has occurred, signaling indicative of performance of an operation to stop providing power to the plurality of memory components can be generated. The signaling indicative of performance of the operation to stop providing power to the plurality of memory components can be sequentially applied to each of the memory components such that the power control signal is applied to the first memory component among the plurality of memory components at a first time, and applied to the second memory component among the plurality of memory components at a second time. This can continue for each of the memory components until each of the memory components have been powered down.

Figure 5:
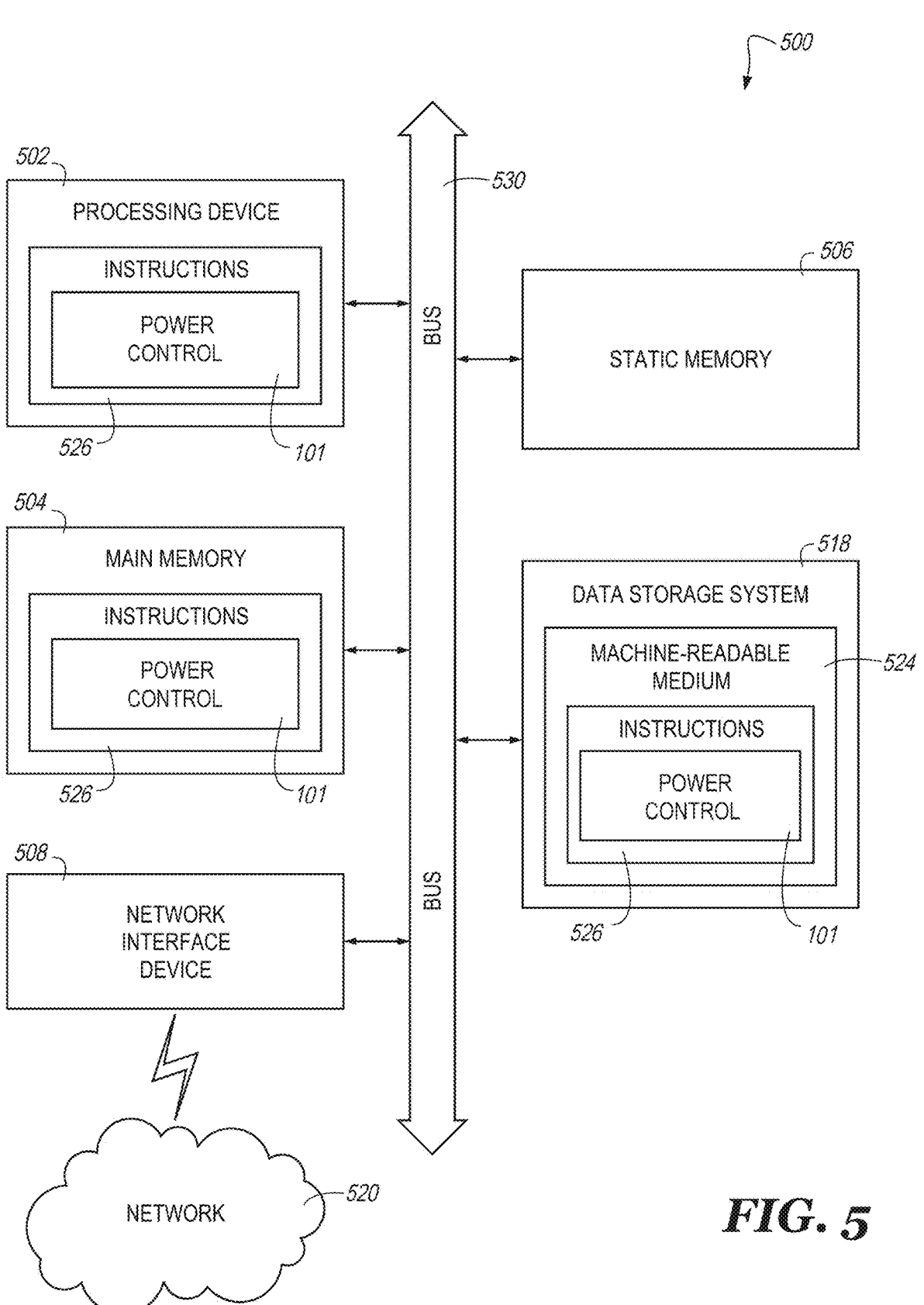
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PCC system 101 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a PCC system 101 (e.g., the PCC system 101 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
determining that a power event involving a memory sub-system has occurred;
in response to the determination that the power event has occurred, generating signaling indicative of performance of an operation to provide power to a plurality of memory components of the memory sub-system, wherein the signaling indicative of performance of the operation to provide power to the plurality of memory components is sequentially applied to each of the memory components, wherein the signaling that is indicative of performance includes a power control signal that is:
applied to a first memory component among the plurality of memory components at a first time, and
applied to a second memory component among the plurality of memory components at a second time, wherein the power control signal is applied to the second memory component subsequent to the first memory component entering a steady state.

2. The method of claim 1, wherein the signaling indicative of performance of the operation to provide power includes a power control signal associated with a first power domain and a clock signal associated with a first clock domain.

3. The method of claim 2, further comprising controlling the application of the power control signal to the plurality of memory components based on the clock signal using power control chain components coupled to the plurality of memory components.

4. The method of claim 1, further comprising:
determining that each of the plurality of memory components are in a power on steady state; and
discontinuing application of a clock signal associated with performance of the operation to provide power to the plurality of memory components responsive to the determination to reduce an amount of power consumed by the memory sub-system.

5. The method of claim 1, further comprising:
determining that a power-down event involving the plurality of memory components of the memory sub-system has occurred; and
generating, in response to the determination that the power-down event has occurred, signaling indicative of performance of an operation to stop providing power to the plurality of memory components, wherein the signaling indicative of performance of the operation to stop providing power to the plurality of memory components is sequentially applied to each of the memory components such that the power control signal is:
applied to the first memory component among the plurality of memory components at a first time, and
applied to the second memory component among the plurality of memory components at a second time.

6. An apparatus, comprising:
a plurality of memory components coupled to one another via a power control line; and a power control chain controller, comprising a power
controller and a clock controller, coupled to the plu-
rality of memory components, wherein the power con-
troller is configured to:
determine that a power event involving the plurality of
memory components has occurred; and
apply signaling indicative of a power event involving
the plurality of memory components, to the power
control line to cause the power control line to:
sequentially apply a power control signal generated
by the power controller to each of the memory
components, via the power control line, such that
a power control signal is:
applied to a first memory component among the
plurality of memory components at a first rising
edge of a clock signal pulse generated by the
clock controller, and
applied to a second memory component among
the plurality of memory components at a second
rising edge of the clock signal pulse generated
by the clock controller.

7. The apparatus of claim 6, wherein:
a first subset of the plurality of memory components are
physically arranged on a die based on the first subset of
the plurality of memory components associated with a
first power domain or a first clock domain, or both,
associated therewith, and
a second subset of the plurality of memory components
are physically arranged on a die based on the second
subset of the plurality of memory components associ-
ated with a second power domain or a second clock
domain, or both, associated therewith.

8. The apparatus of claim 6, wherein the signaling indica-
tive of performance of the operation to provide power
includes the power control signal and the clock signal and
wherein the power control signal is associated with a first
power domain and the clock signal is associated with a first
clock domain.

9. The apparatus of claim 8, further comprising a plurality
of power control chain components wherein:
a memory component among the plurality of memory
components is associated with a second power domain;
and
a power control chain component of the plurality of power
control chain components comprises a level shifter, the
level shifter configured to:
change the power domain of the power control signal
from the first power domain to the second power
domain; and
change a power domain of the clock signal from the first
power domain to the second power domain.

10. The apparatus of claim 8, further comprising a plu-
rality of power control chain components wherein:
a memory component among the plurality of memory
components is associated with a second clock domain;
and
a power control chain component of the plurality of power
control chain components comprises a synchronizing
clock shaper, the synchronizing clock shaper config-
ured to change the clock domain of the clock signal
from the first clock domain to the second clock domain.

11. The apparatus of claim 6, wherein at least one memory
component among the plurality of memory components
comprises a random access memory or a flash memory.

12. A system, comprising:
a plurality of memory components arranged in series;
a first power control chain, comprising:

a plurality of power control chain components separating
the plurality of memory components arranged in series;
and
a first power control line coupling the plurality of memory
components and the plurality of power control chain
components to one another;
a power controller, coupled to the first power control
chain, and configured to generate a power control
signal;
a clock controller, coupled to the plurality of power
control chain components, of the first power control
chain, and configured to generate clock signal pulses at
set intervals; and
a processing device coupled to the power controller and
the clock controller, wherein the processing device is
configured to:
determine a power event criterion has been met;
based on the determination that the power event crite-
rion has been met, cause the power controller to
generate the power control signal to the first power
control chain;
based on the determination that the power event crite-
rion has been met, cause the clock controller to
generate clock signal pulses to the plurality of power
control chain components of the first power control
chain;
cause a first memory component to power up based on
receiving the power control signal;
cause a first power control chain component to activate
after the set interval based on receiving a first clock
signal pulse from the clock controller;
cause a second memory component to power up based
on receiving the power control signal due to the
activation of the first power control chain compo-
nent,
cause any subsequent power control chain components
to activate sequentially, each activation separated by
the set interval; and
cause any additional memory components to power up
based on receiving the power control signal due to
the activation of the subsequent power control chain
components.

13. The system of claim 12, wherein the power event
criterion is the occurrence of a power event involving a
plurality of memory components of a memory sub-system.

14. The system of claim 12, wherein one or more power
control chain component of the plurality of power control
chain components is a level shifter configured to change a
power domain of the power control signal.

15. The system of claim 12, wherein one or more power
control chain component of the plurality of power control
chain components is a synchronizing clock expander con-
figured to change the clock signal pulses from a first clock
domain to a second clock domain.

16. The system of claim 12, wherein one or more power
control chain component of the plurality of power control
circuitry components is a flip-flop configured to cause a
memory component to receive a power control signal based
on the flip-flip receiving a clock signal pulse.

17. The system of claim 12 wherein activating a power
control chain component causes a plurality of memory
components to receive the power control signal.

18. The system of claim 12, wherein one or more memory
component is a memory component area cluster.

19. The system of claim 12, further comprising:
a second power control chain coupled to the power
controller, comprising:

a second plurality of power control chain components separating a second plurality of memory components arranged in series, the second plurality of power control chain components coupled to the clock controller; and a second power control line coupling the second plurality of memory components and the second plurality of power control chain components to one another; and wherein, based on the determination that the power event criterion has been met, the power controller is configured to:

cause the power controller to also generate the power control signal to the second power control chain;

cause the clock controller to also generate clock signal pulses to the second plurality of power control chain components of the second power control chain;

cause a first memory component of the second plurality of memory components to power up based on receiving the power control signal;

cause a first power control chain component of the second plurality of power control chain components to activate after the set interval based on receiving a first clock signal pulse from the clock controller;

cause a second memory component of the second plurality of memory components to power up based on receiving the power control signal due to the activation of the first power control chain component of the second plurality of power control chain components, cause any subsequent power control chain components of the second plurality of power control chain components to activate sequentially, each activation separated by the set interval; and cause any additional memory components of the second plurality of memory components to power up based on receiving the power control signal due to the activation of the subsequent power control chain components of the second plurality of control chain components.

20. The system of claim 12, wherein one or more memory component, or the plurality of memory components comprises a random access memory or a flash memory.

* * * * *